(12) United States Patent
Mansoori et al.

(10) Patent No.: US 6,872,610 B1
(45) Date of Patent: Mar. 29, 2005

(54) METHOD FOR PREVENTING POLYSILICON MUSHROOMING DURING SELECTIVE EPITAXIAL PROCESSING

(75) Inventors: Majid M. Mansoori, Plano, TX (US); Zhigiang Wu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/716,025

(22) Filed: Nov. 18, 2003

(51) Int. Cl.[7] .............................. H01L 21/336
(52) U.S. Cl. .................................... 438/197
(58) Field of Search .................. 438/770, 752, 438/478, 422, 380, 197, 22; 257/411, 347, 36

(56) References Cited

U.S. PATENT DOCUMENTS

| | | |
|---|---|---|
| 6,200,867 B1 | 3/2001 | Chen |
| 6,313,505 B2 | 11/2001 | Yu |
| 6,594,293 B1 | 7/2003 | Bulsara et al. |
| 2002/0182815 A1 | 12/2002 | Hu et al. |
| 2003/0025163 A1 | 2/2003 | Kwon |

*Primary Examiner*—Craig A. Thompson
*Assistant Examiner*—Monica D. Harrison
(74) *Attorney, Agent, or Firm*—Wade James Brady, III; Frederick J. Telecky, Jr.

(57) ABSTRACT

Methods are presented, in which an oxide protection layer is provided on a gate structure for protection against poly mushrooming during selective epitaxial silicon deposition in fabricating elevated or recessed source transistors. In one implementation, the protection layer is constructed by depositing silicon germanium over a gate polysilicon layer prior to gate patterning, and oxidizing the device to form a silicon germanium oxide over the gate polysilicon. The protection layer is then removed following selective epitaxial deposition.

20 Claims, 12 Drawing Sheets

METHOD FOR PREVENTING POLYSILICON MUSHROOMING DURING SELECTIVE EPITAXIAL PROCESSING

FIELD OF INVENTION

The present invention relates generally to semiconductor devices and more particularly to methods for fabricating transistors while avoiding polysilicon mushrooming during selective epitaxial deposition processes.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a gate contact or electrode is energized to create an electric field in a channel region of a semiconductor body, by which electrons are allowed to travel through the channel between a source region and a drain region of the semiconductor body. The source and drain regions are typically formed by adding dopants to targeted regions on either side of the channel. A gate dielectric or gate oxide is formed over the channel, and a gate electrode or gate contact is formed over the gate dielectric. The gate dielectric and gate electrode layers are then patterned to form a gate structure overlying the channel region of the substrate. Complementary MOS (CMOS) devices have become widely used in the semiconductor industry, wherein both n-channel and p-channel (NMOS and PMOS) transistors are used to fabricate logic and other circuitry.

Continuing trends in semiconductor product manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate oxide that is formed over the semiconductor surface. However, scaled MOS transistors suffer from so-called short channel effects, wherein simply reducing the transistor channel length may degrade performance. Short channel effects include increased off-state (e.g., leakage) current, punch-through current, carrier drift velocity saturation, threshold voltage shifts, degraded subthreshold slope, and degraded output current. In addition, drain voltages may have a greater impact on channel performance in short channel devices, wherein the barrier for electron injection from the source to the drain may be decreased, a situation sometimes referred to as drain induced barrier lowering (DIBL).

Scaled MOS transistors may also suffer from channel hot carrier effects. For example, during saturation operation of a MOS transistor, electric fields are established near the lateral junction of the drain and channel regions. These fields causes channel electrons to gain kinetic energy and become "hot". Some of these hot electrons traveling to the drain are injected into the thin gate dielectric proximate the drain junction. The injected hot carriers lead to undesired degradation of the MOS device operating parameters, such as a shift in threshold voltage, changed transconductance, changed drive current/drain current exchange, and device instability. To combat short channel and channel hot carrier effects, drain extension regions are commonly formed in the substrate, which are variously referred to as double diffused drains (DDD), lightly doped drains (LDD), moderately doped drains (MDD), and heavily doped drains (HDD). These relatively shallow drain extension regions absorb some of the potential into the drain and away from the drain/channel interface, thereby reducing channel hot carriers and the adverse performance degradation associated therewith.

While such ultra-shallow drain extensions help to alleviate short channel effects, these structures may cause high series resistance and parasitic capacitance that offset the performance gains achieved through scaling. Scaled semiconductor devices have accordingly been introduced wherein selective epitaxial growth (SEG) is employed to form an epitaxial layer in an elevated source/drain (ESD) structure. Elevating the source/drain regions operates to reduce the series resistance of the transistor, suppress short channel effects, counteract parasitic bipolar transistor action, and also provides extra silicon material for consumption during subsequent silicidation to form source/drain contacts.

In other devices, recesses are formed in the source/drain regions of the substrate, which are then filled with deposited epitaxial silicon, wherein the epitaxial growth may be continued to elevate the source/drains above the original substrate level. Providing deposited silicon may further enhance transistor device performance by inducing strain in the channel substrate material, thereby increasing carrier mobility therein. In this regard, carrier (e.g., hole) mobility in PMOS devices has benefited from introduction of uniaxial compressive strain along the direction of the channel by depositing silicon in recesses of the source/drain regions outlying the channel. For NMOS devices, electron mobility may be enhanced by a number of techniques, for example, by forming a tensile strained pre-metal dielectric (PMD) material over the transistor to create a tensile strain in the channel.

Thus, selective epitaxial growth techniques advantageously reduce short channel effects and may also be used to improve carrier mobility in scaled MOS transistors. However, selective deposition of silicon material to fill source/drain recesses and/or to elevate source/drain structures may result in deposition or growth over the gate contact. In particular, where the gate contact material is polysilicon and the polysilicon is unprotected, selective epitaxial growth processes result in deposition of single crystal silicon on the silicon source/drain regions as well as formation of polycrystalline silicon material (e.g., polysilicon) on the polysilicon gate. The deposition or growth on the polysilicon gate proceeds both vertically as well as laterally, wherein the deposited polysilicon extends outward over portions of the gate sidewall spacers. This phenomena is sometimes referred to as poly mushrooming.

The lateral extension of the gate polysilicon reduces the poly-to-contact spacing in the device, thereby making manufacturing more difficult. The vertical extension of the gate polysilicon also adds to the height of the transistor gate, which may hinder efforts to provide dopants in the gate polysilicon near the gate dielectric interface, leading to poly depletion problems. Alternatively, the gate polysilicon can be initially made thinner than a desired final gate electrode thickness, but this does not help poly-to-contact spacing problems and may make controlling the final thickness more difficult, particularly as the selective deposition provides three dimensional growth. Thus, there is a need for improved techniques for fabricating elevated and/or recessed source/drain MOS transistors to combat short channel effects in scaled devices, while avoiding or mitigating the adverse effects of gate poly mushrooming.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention provides methods in which a protection layer is provided on a gate structure to inhibit poly mushrooming during selective epitaxial silicon deposition in fabricating elevated or recessed source/drain transistors.

In accordance with an aspect of the present invention, transistor fabrication methods are provided, in which a gate dielectric layer and a gate contact or electrode layer (e.g., polysilicon) are formed above a semiconductor body. A protection layer, such as silicon germanium, is formed above the gate dielectric layer, and the protection and gate electrode layers are then selectively etched to form a patterned gate structure. The protection layer and an exposed portion of the semiconductor body are oxidized to form a first oxide material on the gate and a second oxide material on the semiconductor body. In one example, the oxidation creates silicon germanium oxide over the gate polysilicon, and silicon oxide over prospective source/drain regions of the substrate.

A first clean operation, such as an oxide deglaze, is used to remove the second oxide material from the semiconductor body, while leaving a portion of the first oxide material remaining on the patterned gate structure. In the examples illustrated and described below, silicon germanium oxide is formed during the oxidation process at a faster rate than silicon oxide forms over the source/drain regions of the substrate. In this case, the oxide deglaze operation can be stopped after the silicon oxide is removed and while silicon germanium oxide still remains to protect the gate.

A selective semiconductor material deposition process (e.g., selective epitaxial growth) is then performed with the first oxide material on the patterned gate structure, to form a semiconductor material (e.g., epitaxial single crystal silicon) on the exposed portion of the semiconductor body. Due to the selective nature of the selective epitaxial process, substantially no semiconductor material is formed on the silicon germanium oxide covering the gate polysilicon. A second clean operation is then performed after the deposition process to remove the first oxide material from the gate. In an alternative implementation, the exposed portion of the semiconductor body can optionally be recessed after the first clean operation and prior to the selective semiconductor material deposition process. The invention may thus be employed in fabricating elevated and recessed source/drain devices.

Another aspect of the invention provides methods for protecting a transistor gate structure during a selective epitaxial deposition process comprising forming silicon germanium oxide above a gate structure, performing a selective epitaxial deposition process while the silicon germanium oxide is above the gate structure, and removing the silicon germanium oxide after the selective epitaxial deposition process. The silicon germanium oxide can be formed by any techniques, such as depositing silicon germanium over a gate material layer, and oxidizing the silicon germanium to form silicon germanium oxide before or after gate patterning, and before or after forming sidewall spacers along the edges of the patterned gate structure. Where the gate is patterned prior to the oxidation, the exposed substrate is also oxidized, for example, to form silicon oxide over prospective source/drain regions thereof. A clean operation may be performed prior to the selective epitaxial deposition process, to remove silicon oxide from the semiconductor body while leaving silicon germanium oxide over the gate material layer. In one possible alternative implementation, a portion of the exposed semiconductor body may be recessed, for example, through selective etching, following the clean operation and prior to the selective epitaxial deposition process, to construct a recessed source/drain device.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
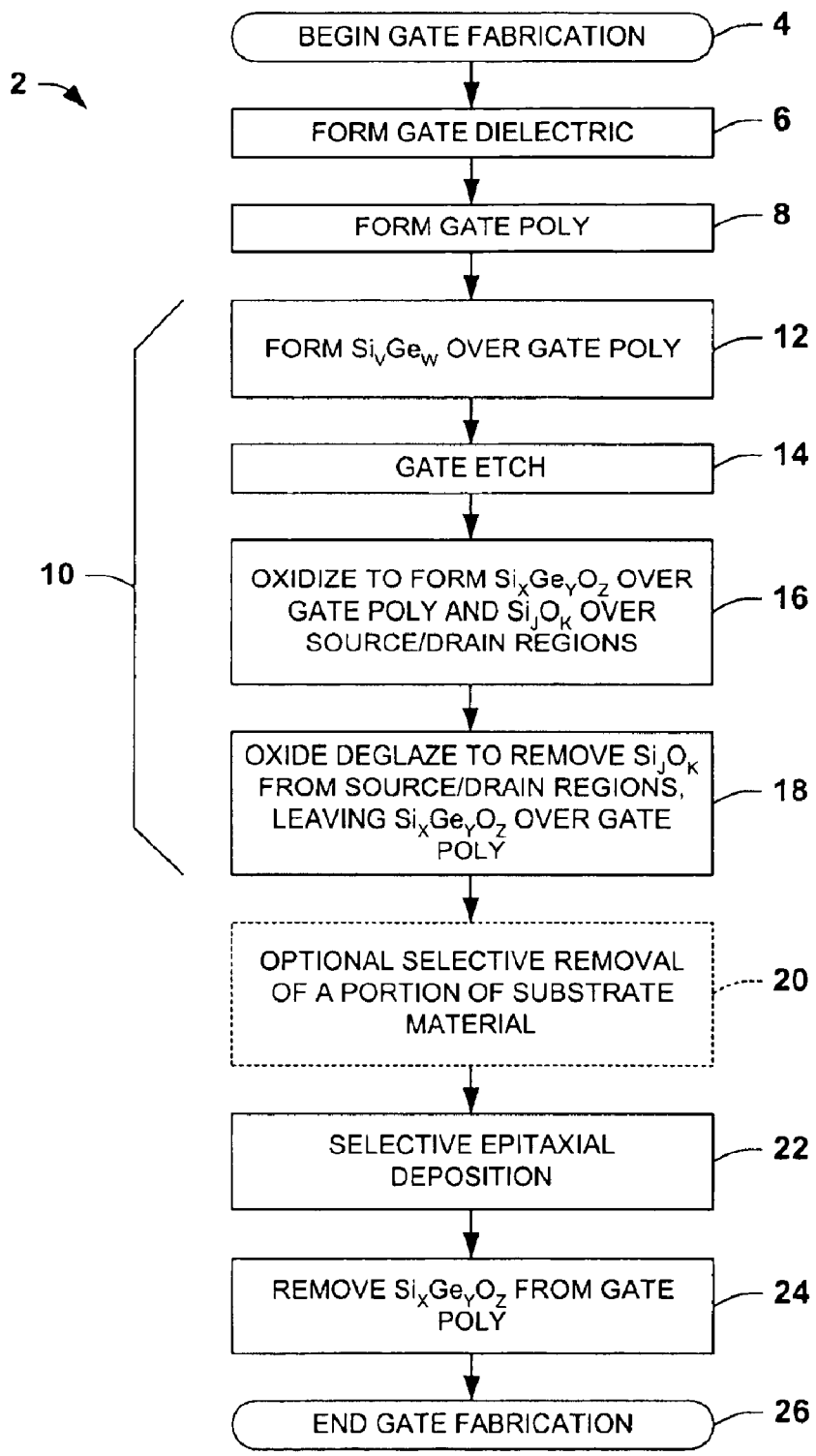
FIG. 1 is a simplified flow diagram illustrating an exemplary method of fabricating transistor gate structures in accordance with the present invention.

One or more implementations of the present invention will now be described with reference to the attached drawings, wherein like reference numerals are used to refer to like elements throughout. The invention relates to semiconductor devices formed using selective epitaxial deposition or growth processes, wherein poly mushrooming is prevented or inhibited by providing a protection layer above a patterned gate structure during the selective deposition. The invention is illustrated and described below in conjunction with exemplary PMOS transistors in which deposited silicon is used in forming elevated or raised source/drains or to fill in recesses in recessed source/drain or recessed HDD transistors. However, the invention may be employed, alternatively or in combination, in fabricating NMOS transistors, wherein the invention is not limited to the illustrated examples, and wherein the illustrated structures are not necessarily drawn to scale.

Referring initially to FIG. 1, an exemplary method 2 is illustrated for fabricating transistors and gate structures therefor without poly mushrooming in accordance with one or more aspects of the present invention. While the method 2 and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. The methods according to the present invention, moreover, may be implemented in association with the fabrication of devices illustrated and described herein as well as in association with other devices and structures not illustrated.

Beginning at 4, a gate dielectric is formed over a semiconductor body at 6 using any suitable materials, material thicknesses, and processing steps, including a single thermal oxidation or deposition or combinations thereof to form a gate dielectric above a semiconductor body. The invention may be employed in fabricating semiconductor devices using any type of semiconductor body, including but not limited to silicon substrates, partially and fully depleted SOI wafers, wafers having virtual substrates (e.g., thick or thin SiGe or GaAs layers and/or InGaAs graded layers formed on Silicon substrates, substrates in which transistor channels extend vertically, etc.). In addition, the invention may be employed in conjunction with any gate dielectric material, such as $SiO_2$, SiON, high-k dielectrics, and stacks or combinations thereof, and separate processing may optionally be employed to form different gate dielectrics in the NMOS and PMOS regions within the scope of the invention. In the examples illustrated and described below, a single thermal oxidation is performed at 6 to create a thin silicon dioxide ($SiO_2$) gate oxide overlying a silicon substrate. At 8, a gate electrode layer is formed above the gate dielectric layer, for example, by depositing a layer of polysilicon to any desired thickness. A protection layer is then formed at 10 to protect the gate electrode layer during subsequent selective epitaxial deposition at 22 below.

At 12, a protection layer material is formed over the gate polysilicon. In the exemplary implementations illustrated below, silicon germanium (e.g., $Si_VGe_W$, where V and W are any positive values) is deposited via any suitable deposition process to any suitable thickness at 12, although other materials may be employed within the scope of the invention. Silicon germanium advantageously has a higher oxidation rate than does silicon oxide, allowing selective removal of the silicon oxide from prospective source/drain regions below at 18 while leaving silicon germanium oxide over the patterned gate. The protection and polysilicon layers are then selectively patterned at 14 to define a patterned gate structure, for example, using an etch mask and a reactive ion etch (RIE) process or other suitable patterning techniques, by which a portion of the semiconductor body is exposed in prospective source/drain regions.

At 16, an oxidation process is performed in which the protection layer and the exposed portion of the semiconductor body are oxidized to form a first oxide material on the patterned gate structure and a second oxide material on the exposed portion of the semiconductor body. Any suitable oxidation processing may be undertaking at 16 in accordance with the invention, for example, exposing the wafer to an oxidizing ambient at elevated temperature (e.g., a wet low-temperature thermal oxidation process), by which first and second oxide materials are formed over the gate electrode layer and over the prospective source/drain regions of the substrate, respectively. In the case of a silicon semiconductor body and a silicon germanium protection layer, the oxidation at 16 creates silicon germanium oxide (e.g., $Si_XGe_YO_Z$, where X, Y, and Z can be any positive values) over the gate material layer. In this example, the oxidation at 16 also creates silicon oxide (e.g., $Si_JO_K$, where J and K can be any positive values) over the exposed portion of the semiconductor body. In a preferred implementation, the oxidation process at 16 consumes all or substantially all of the silicon germanium deposited at 12. Although the invention is illustrated and described in the context of $Si_XGe_YO_Z$ and $Si_JO_K$, any first and second differing oxides are contemplated as falling within the scope of the invention and the appended claims.

At 18, a first oxide deglaze (e.g., HF clean) or other suitable oxide removal process is performed to remove the second oxide material (e.g., $Si_JO_K$) from the semiconductor body, while leaving at least a portion of the first oxide material (e.g., $Si_XGe_YO_Z$) on the patterned gate structure. In one possible alternative, the silicon germanium protection layer can be oxidized (16 in FIG. 1) prior to gate patterning, in which case, the first oxide removal at 18 can be omitted. In the illustrated example, moreover, an optional selective silicon removal process (e.g., wet or dry etch) may be performed, that removes a portion of the exposed semiconductor body, thereby creating a recess. In one example, sidewall spacers are formed along the lateral sides of the patterned gate structure before forming the recesses at 20. These recesses are then backfilled with silicon or other semiconductor material to create a recessed source/drain transistor, as illustrated and described below with respect to FIGS. 4 and 5A–5G. In another example, recesses are created before forming sidewall spacers, in constructing a recessed HDD device, as illustrated in FIGS. 6 and 7A–7I below. Elevated source/drain devices may be constructed with or without such recessing at 20, wherein one example is illustrated below in FIGS. 2 and 3A–3I.

At 22 in FIG. 1, a selective semiconductor material deposition process is performed, such as a selective epitaxial growth (SEG). In the case where no recess was formed at 20, the deposition at 22 provides silicon or other semiconductor material (e.g., Si, SiGe, etc.) over the prospective source/drain regions of the semiconductor body, thereby elevating the source/drain surface above the substrate. The selective deposition, moreover, may be performed at 22 either before or after drain extension implants, and before or after deeper source/drain implants and associated activation anneals within the scope of the invention. Any suitable material formation process may be employed at 22, (e.g., such as chemical vapor deposition, etc.) that selectively deposits semiconductor material over pre-existing semiconductor material, and which deposits little or no material over pre-existing dielectrics. In this regard, where the exposed portion of the semiconductor body comprises single crystalline silicon, the deposition at 22 forms epitaxial single crystal silicon thereover, thereby elevating the source/drain regions. However, since the gate polysilicon is covered by the first oxide (e.g., silicon germanium oxide), no deposition occurs on the gate, whereby the adverse effects of poly mushrooming are avoided. Following the selective epitaxial deposition at 24, the remaining first oxide material is removed at 24, via any suitable oxide removal processing. In one example, the removal at 24 is a second oxide deglaze (e.g., HF clean) or other oxide removal process to remove the silicon germanium oxide from the gate electrode layer without detrimental impact on the source/drain regions. Thereafter, the gate fabrication ends at 26.

As illustrated in FIG. 1, the methods of the present invention advantageously avoid or mitigate poly mushrooming, while allowing fabrication of a variety of different transistors that employ selective epitaxial growth or deposition processing. The invention may be implemented as a few simple and inexpensive steps incorporated in existing fabrication process flows, for example, wherein the exemplary deposition and low-temperature wet oxidation of silicon germanium and the HF deglaze operations are compatible with conventional CMOS processing. By avoiding poly mushrooming, moreover, the invention facilitates accurate and repeatable tailoring of gate height, and mitigates poly depletion, while allowing all the benefits of elevated source/drains and/or controlled introduction of channel strain through selective epitaxial deposition in recessed portions of the semiconductor body. As illustrated further in the following examples, the invention finds utility in fabrication of many types of transistors wherein selective material deposition is employed, including but not limited to elevated drain, recessed drain, and recessed drain extension (e.g., recessed HDD) transistor structures.

Figure 2:
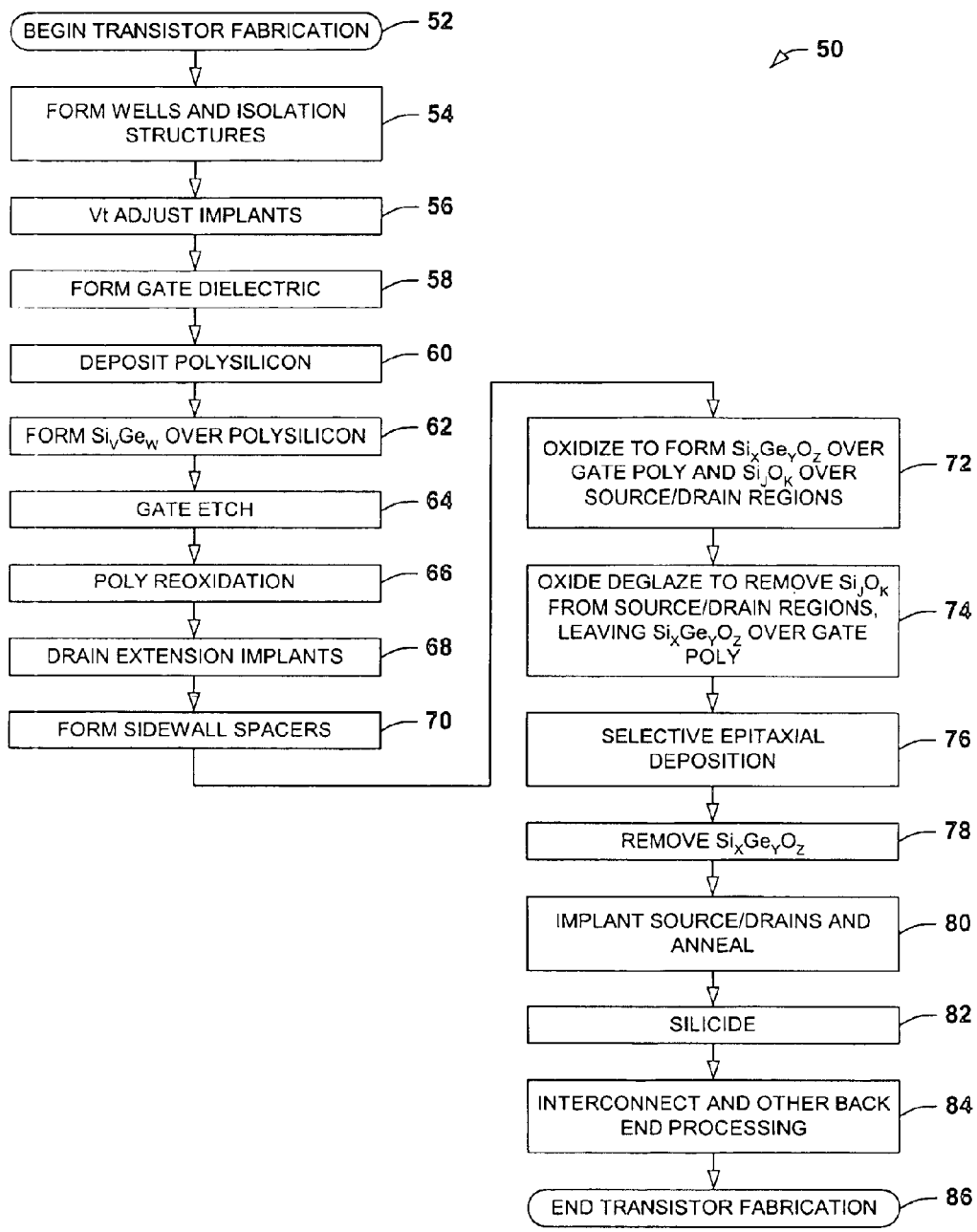
FIG. 2 is a detailed flow diagram illustrating an exemplary method of fabricating an elevated source/drain transistor in accordance with the invention.
Figure 3A:
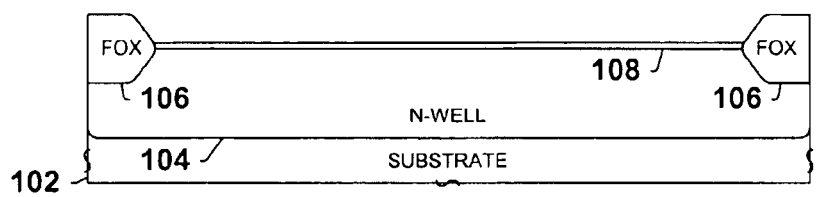
FIGS. 3A–3I are partial side elevation views in section illustrating an exemplary semiconductor device having an elevated source/drain transistor undergoing fabrication processing in accordance with the invention.

FIGS. 2 and 3A–3I illustrate a detailed implementation of the invention in fabricating a raised or elevated source/drain MOS transistor. FIG. 2 illustrates an exemplary method 50 in accordance with the invention, and FIGS. 3A–3I illustrate an exemplary semiconductor device 100 at various stages of fabrication processing generally in accordance with the method 50. Referring initially to FIGS. 2 and 3A, the method 50 begins at 52 in FIG. 2, including front end processing at 54 to form wells and isolation structures. As shown in FIG. 3A, the semiconductor device 100 includes a silicon substrate semiconductor body 102 with an n-well 104 formed in a PMOS region thereof, as well as field oxide (FOX) isolation structures 106 formed by local oxidation of silicon (LOCOS). Other isolation structures 106 may alternatively be constructed at 54, for example, using shallow trench isolation (STI) techniques. Channel engineering implants, such as threshold voltage (Vt) adjust and punchthru implants may be performed (e.g., 56 in the method 50), and a gate dielectric 108 is formed (e.g., at 58 in FIG. 2) over the surface of the substrate 102 between the FOX isolation structures 106. In the illustrated device 100, the gate dielectric 108 is a thermally grown $SiO_2$, although any suitable dielectric may be formed within the scope of the invention, including single or multi-layer dielectric structures, for example, comprising high-k dielectric materials.

Figure 3B:
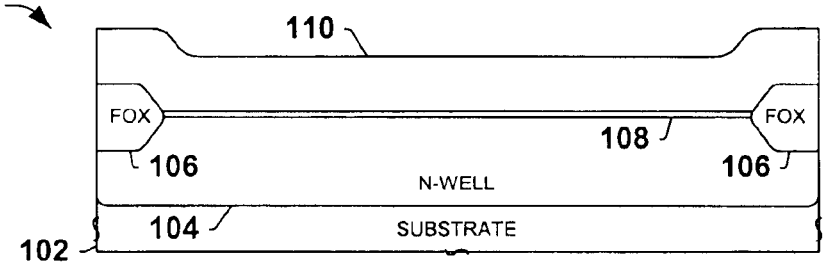
Figure 3C:
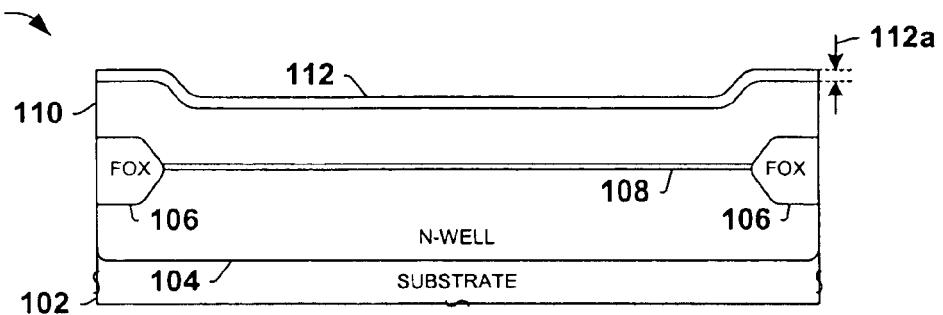

In FIG. 3B, polysilicon 110 is deposited or otherwise formed over the gate dielectric 108 (at 60 in FIG. 2), to operate as a gate contact or electrode material layer in a subsequently patterned gate structure. In FIG. 3C, a protection layer material 112 is formed over the gate polysilicon 110 via a chemical vapor deposition (CVD) deposition process 114 (62 in the method 50 of FIG. 2). In the exemplary implementations illustrated herein, silicon germanium (e.g., $Si_VGe_W$, where V and W are any positive values) is deposited via any suitable deposition process 114 to a thickness 112a of about 100 Å, although other materials 112, thicknesses 112a, and deposition processes 114 may be employed within the scope of the invention.

Figure 3D:
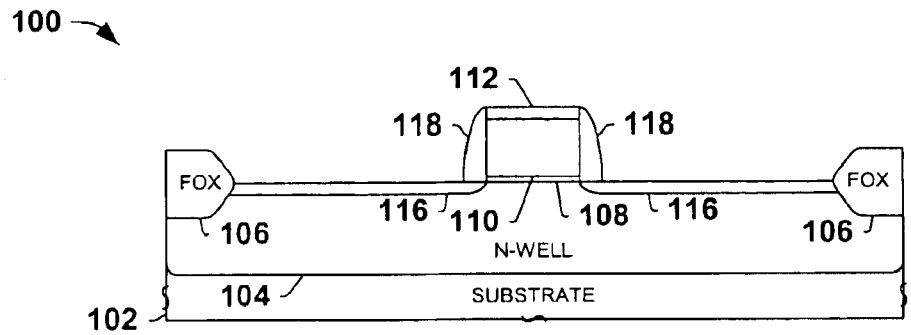

In FIG. 3D, the protection and polysilicon layers 112 and 110 are selectively patterned (gate etch 64 in FIG. 2) to define a patterned gate structure. The sidewalls of the patterned polysilicon 110 may then be reoxidized (66 in FIG. 2) to form a protective encapsulation layer thereon (not shown). Shallow drain extension (e.g., LDD, MDD, or HDD) implants are performed (68 in FIG. 2) to introduce dopants (e.g., boron or other p-type impurities in the illustrated PMOS example) into the exposed source/drain regions 116 of the device 100 between the gate structure and the field oxide structures 106. Sidewall spacers 118 are then formed (70 in FIG. 2) along the sidewalls of the patterned gate structure, comprising any suitable oxide and/or nitride material or stacks thereof.

Figure 3E:
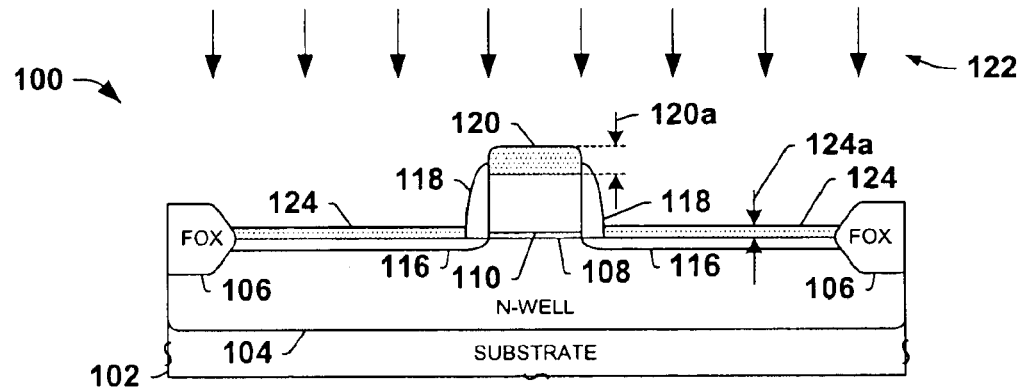

In FIG. 3E, a low temperature wet oxidation process 122 is performed (72 in FIG. 2) to form a first oxide material 120 on the patterned gate structure (e.g., $Si_XGe_YO_Z$) having a thickness 120a of about 170 Å in the illustrated device 100. The oxidation 122 also forms a second oxide material 124 (e.g., $Si_JO_K$) on the exposed portion of the semiconductor body 102 over the prospective source/drains 116, having a thickness 124a of about 100 Å in the illustrated example. It is noted in this example that the polysilicon germanium 112 oxidizes at a faster rate in forming the silicon germanium oxide 120 over the gate, than does the substrate silicon in forming the silicon oxide 124 (e.g., about 70% faster), whereby the silicon germanium oxide thickness 120a is greater than the silicon oxide thickness 124a.

Figure 3F:
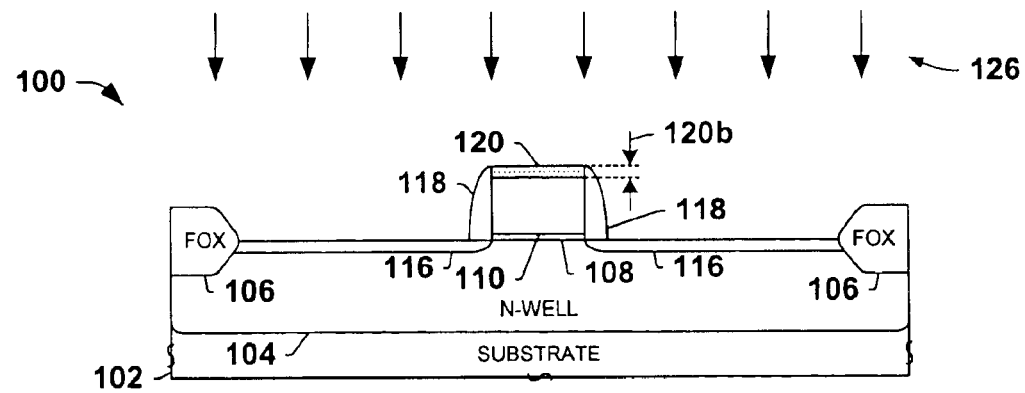

In FIG. 3F, a first oxide deglaze (e.g., HF clean) 126 is performed (74 in FIG. 2), which removes all of the second oxide material 124, while leaving a portion of the first oxide material 120 having a thickness 120b of about 100 Å over the patterned gate polysilicon 110 in the exemplary device 100. In this example, the oxide deglaze operation 126 removes silicon germanium oxide 120 and silicon oxide 124 at approximately equal rates. As a result, the oxidation rate difference between the silicon germanium oxide 120 and the silicon oxide 124 (e.g., the different thicknesses 120a and 124a) facilitates stopping the first oxide deglaze 126 after the silicon oxide 124 has been removed while at least a portion of the silicon germanium oxide 120 remains over the gate. As can be seen in FIG. 3F, the device 100 includes exposed silicon in the source/drain regions 116, with dielectric (e.g., sidewall spacers 118 and the silicon germanium oxide protection layer 120) over the patterned gate structure.

Figure 3G:
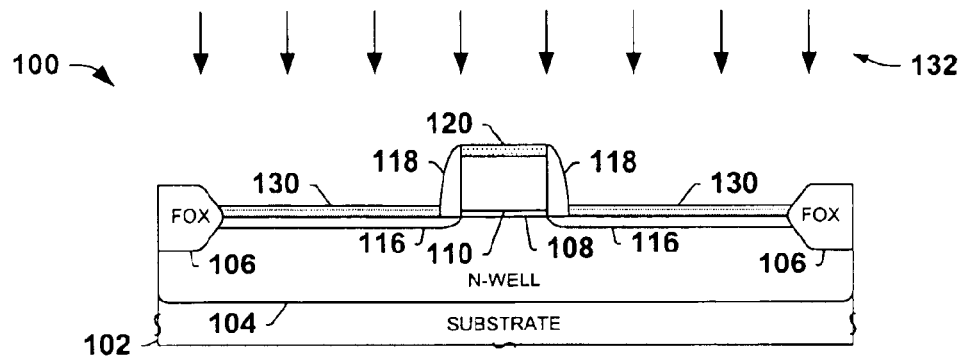
Figure 3H:
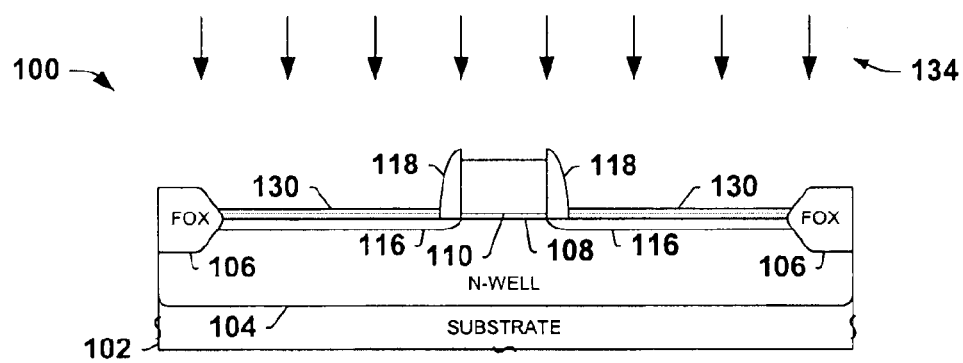
Figure 3I:
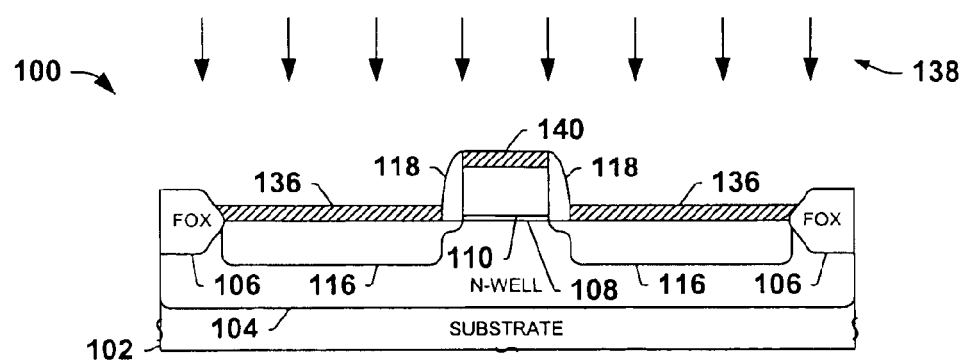

In FIG. 3G, a selective semiconductor material deposition (e.g., CVD) process 132 is performed (76 in FIG. 2) to provide epitaxial silicon 130 over the source/drain regions 116 of the substrate 102 to any desired thickness, without depositing or growing any silicon on the gate polysilicon 110 (e.g., no poly mushrooming) due to the existence of the protection layer 120. In FIG. 3H, the remaining silicon germanium oxide 120 is removed (78 in FIG. 2) via a second oxide deglaze (e.g., HF clean) process 134. Further processing of the device 100 is shown in FIG. 3I, wherein deep source/drain boron implants (80 in FIG. 2) further define the source/drains 116, and silicide contacts 136 and 140 are formed via a silicide process 138 (82 in FIG. 2) over the source/drains 116 and the polysilicon gate 110, respectively. Thereafter, interconnect and other back-end processing (84 in FIG. 2) is performed to complete the elevated source/drain device 100, whereafter the method 50 in FIG. 2 ends at 86.

Figure 4:
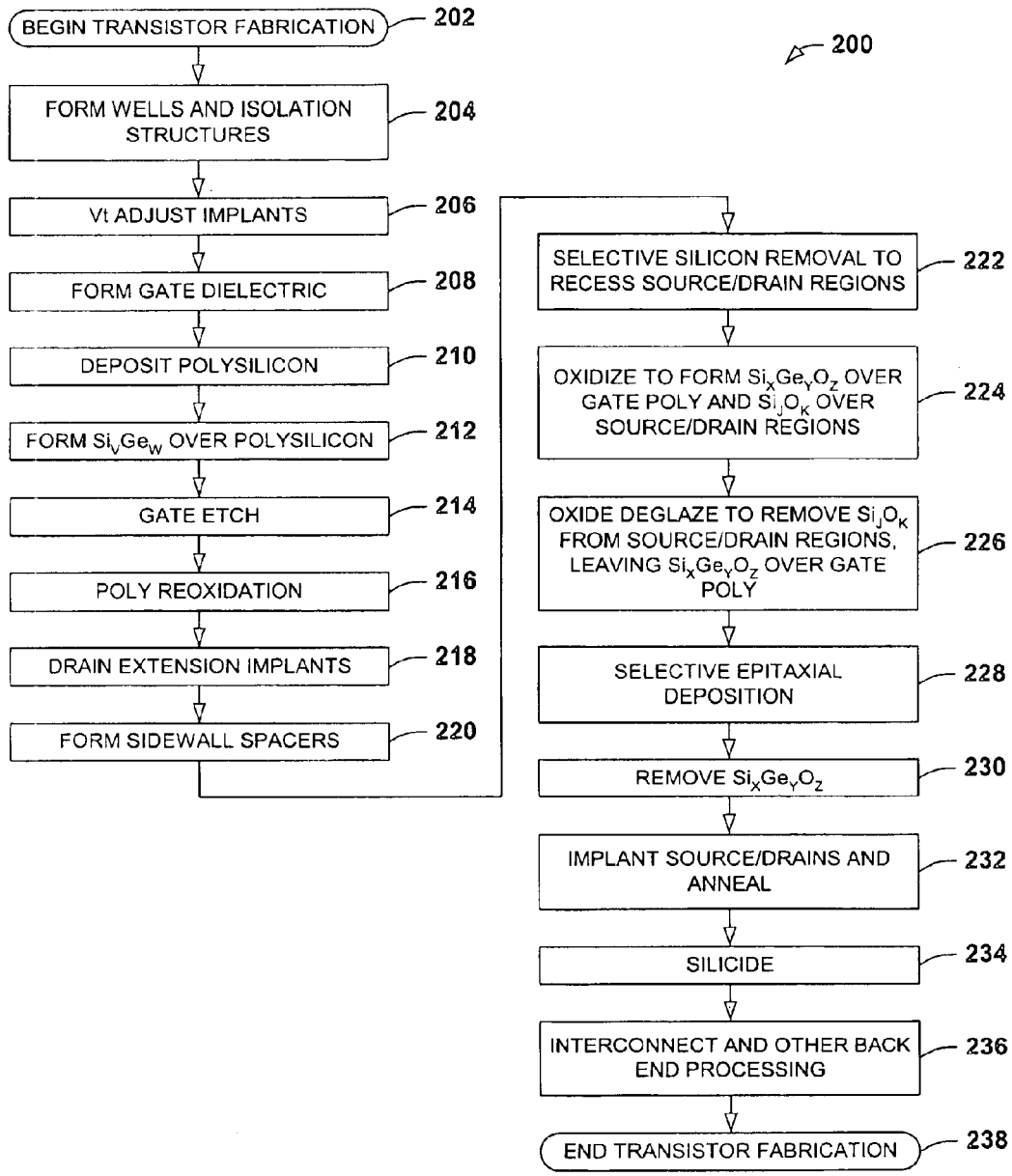
FIG. 4 is a detailed flow diagram illustrating an exemplary method of fabricating a recessed source/drain transistor in accordance with the invention.

Referring now to FIGS. 4 and 5A–5G, another example of the invention is illustrated in the fabrication of a recessed source/drain PMOS transistor in a semiconductor device 300 (FIGS. 5A–5G) generally according to a method 200 (FIG. 4). The method 200 begins at 202, with an n-well 304 and isolation structures 306 being formed in a silicon substrate 302, and Vt adjust or other channel engineering being performed (204 in FIG. 4). Also in FIG. 5A, a gate dielectric 308 is formed (208 in FIG. 4) over the surface of the substrate 302, and polysilicon 310 is deposited over the gate dielectric 308 (210 in FIG. 4). A silicon germanium protection layer 312 is formed over the polysilicon 310 (212 in FIG. 4), after which the protection and polysilicon layers 312 and 310 are patterned (214 in FIG. 4) to define a patterned gate structure. In addition, the gate sidewalls are reoxidized (216 in FIG. 4, not shown in FIG. 5A), shallow drain extension implants are performed (218 in FIG. 4) into exposed source/drain regions 316 of the substrate 302, and sidewall spacers 318 are formed (220 in FIG. 4) along the gate sidewalls.

Figure 5A:
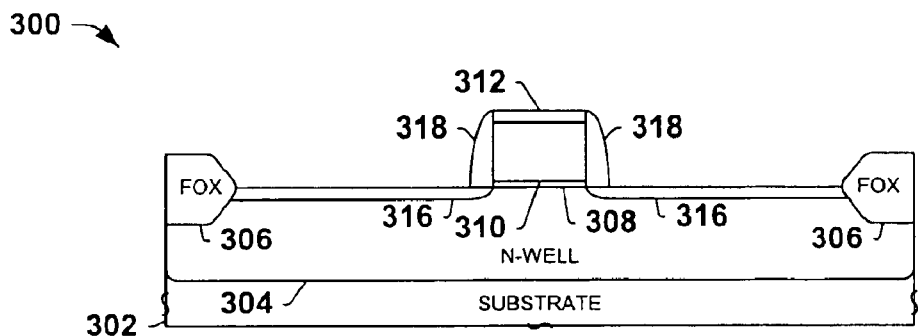
FIGS. 5A–5G are partial side elevation views in section illustrating an exemplary semiconductor device having a recessed source/drain transistor undergoing fabrication processing in accordance with the invention.
Figure 5B:
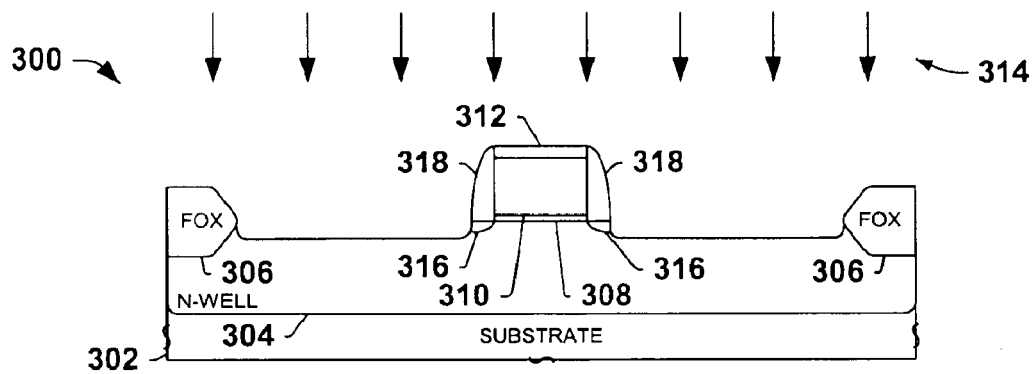
Figure 5C:
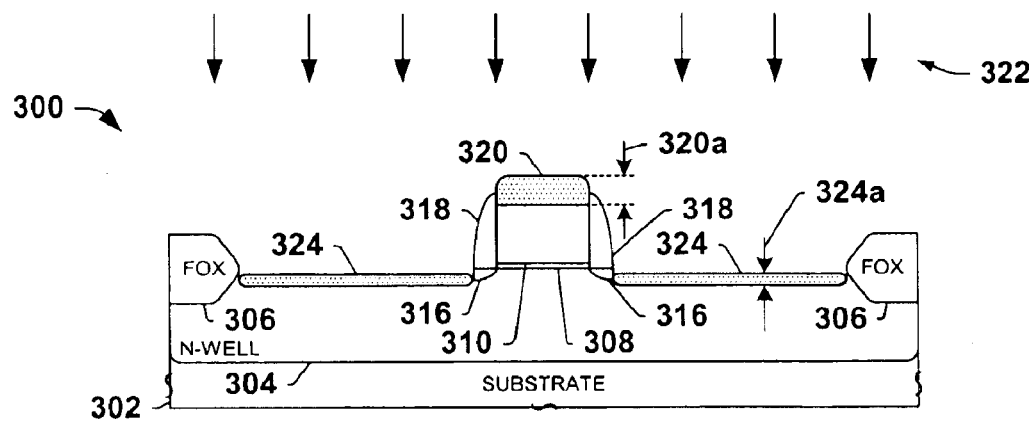

In FIG. 5B, a selective silicon removal process 314 is performed (222 in FIG. 4) to create recesses in the source/drain regions of the substrate 302. The process 314 can be any suitable material removal process that is selective to dielectrics such as the silicon germanium protection material 312, the sidewall spacers 318, and the field oxide 306, and which removes portions of the silicon substrate 302, such as a wet etch employing suitable etch chemistry. Alternatively, a dry etch may be used, with suitable etch mask formed to expose the source/drain regions 316 while covering the patterned gate structure and field oxide 306. In FIG. 5C, a low-temperature wet oxidation process 322 is performed (224 in FIG. 4) to create silicon germanium oxide 320 on the patterned gate structure (e.g., $Si_XGe_YO_Z$) having a thickness 320a of about 170 Å, and silicon oxide 324 (e.g., $Si_JO_K$) having a thickness 324a of about 100 Å in the recessed source/drain portions of the substrate 302. As in the above example, the difference in the oxide thicknesses 320a and 324a is due to the oxidation rate discrepancy between silicon germanium and silicon.

Figure 5D:
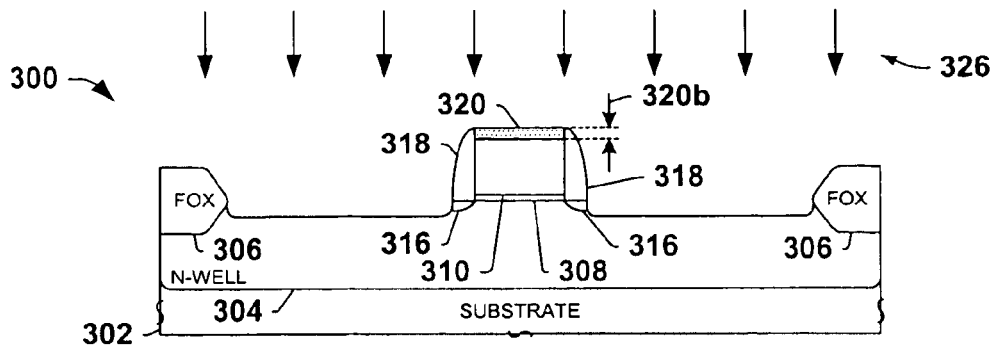
Figure 5E:
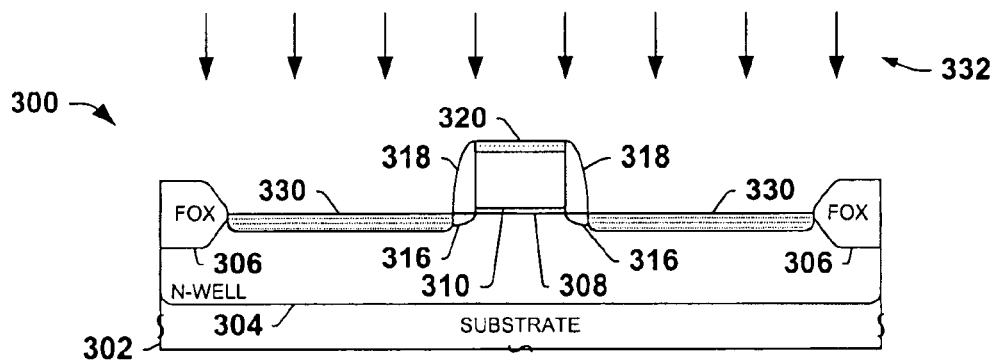

In FIG. 5D, a first oxide deglaze operation 326 is performed (226 in FIG. 4), to remove the silicon oxide 324, leaving a portion of the silicon germanium oxide 320 with a thickness 320b of about 100 Å over the poly gate 310. In FIG. 5E, a selective semiconductor material deposition (e.g., CVD) process 332 is performed (228 in FIG. 4) to provide epitaxial silicon or silicon germanium 330 in the recessed source/drain regions of the substrate 302 to any desired thickness, without depositing or growing any silicon on the gate. In the illustrated example, the deposition 332 substantially fills the recesses created in FIG. 5D, although other implementations are possible in which the deposition 332 is continued in order to elevate the source/drains beyond the original substrate level. The provision of deposited material 330 in the recessed portions of the prospective source/drains may be employed, for example, to induce a uniaxial strain in the channel region of the substrate 102 under the patterned gate structure, thereby advantageously increasing hole mobility therein and accordingly improving current drive in the resulting PMOS transistor. For example, deposition of silicon germanium 330 or other material having a different lattice structure than the substrate 302 causes compressive uniaxial strain in the channel region, leading to increased hole mobility (e.g., as much as 20 to 50% increase in drive current capability) in PMOS transistors.

Figure 5F:
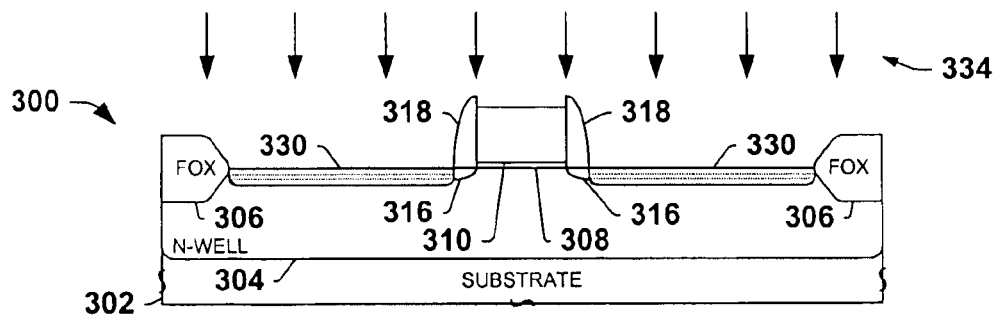
Figure 5G:
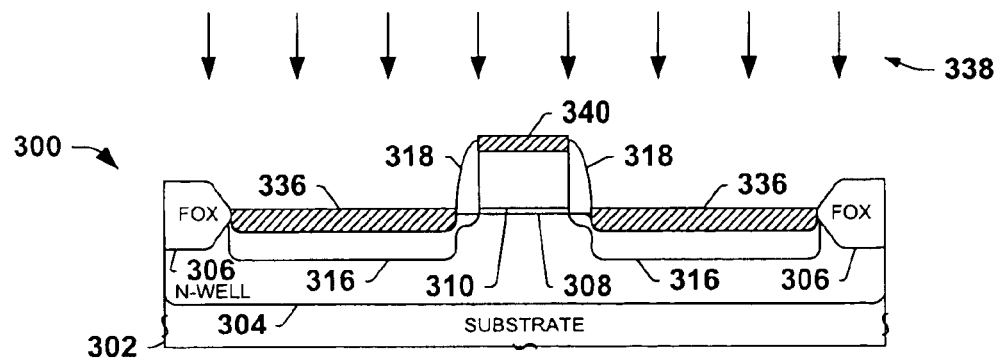

In FIG. 5F, the remaining silicon germanium oxide 320 is removed (230 in FIG. 4) via a second oxide deglaze (e.g., HF clean) process 334, thereby uncovering the gate polysilicon 310 (e.g., without any poly mushrooming). The device 300 can then be processed as per normal processing steps as shown in FIG. 5G. These steps include, for example, deep source/drain implants (232 in FIG. 4), formation of silicide contacts 336 and 340 via a silicide process 338 (234 in FIG. 4) over the source/drains 316 and the polysilicon gate 310, respectively, and interconnect and other back-end processing (236 in FIG. 4), whereafter the method 200 ends at 238.

Figure 6:
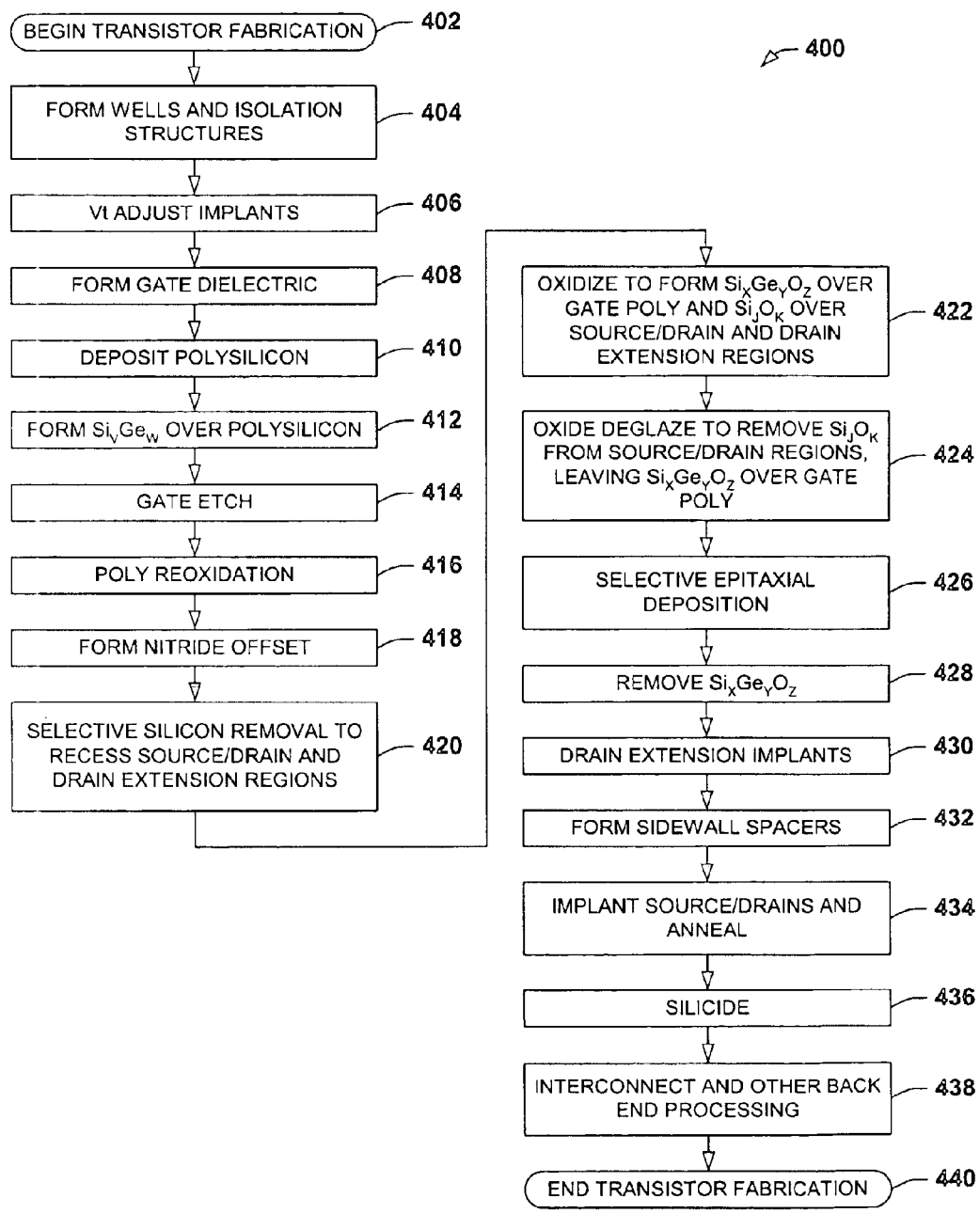
FIG. 6 is a detailed flow diagram illustrating an exemplary method of fabricating a recessed HDD transistor in accordance with the invention.

FIGS. 6 and 7A–7I illustrate another example of the invention, in which a device 500 is fabricated (FIGS. 7A–7I)

with a recessed HDD transistor generally according to a method 400 (FIG. 6). In this case, recessing and filling the source/drains and drain extension regions of the substrate 502 may further enhance hole carrier mobility in PMOS devices by controlled introduction of uniaxial strain along the axis of the channel portion of the substrate 502.

Figure 7A:
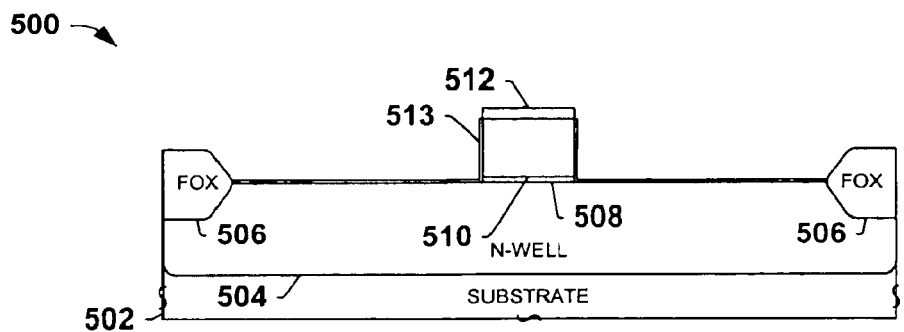
FIGS. 7A–7I are partial side elevation views in section illustrating an exemplary semiconductor device having a recessed HDD transistor undergoing fabrication processing in accordance with the invention.

Referring initially to FIGS. 6 and 7A, the method 400 begins at 402 in FIG. 6, including front end processing to form an n-well 504 and isolation structures 506 in a silicon substrate 502 (404 in FIG. 6). Vt adjust implants and other channel engineering are also performed (406 in FIG. 6), and a gate dielectric 508 is formed (408 in FIG. 6) over the surface of the substrate 502. Polysilicon 510 is deposited over the gate dielectric 508 (410 in FIG. 6) and a protection layer 512 (e.g., silicon germanium of about 100 Å thickness in the illustrated device 500) is formed over the gate polysilicon 510 (412 in FIG. 6). The protection and polysilicon layers 512 and 510 are then etched (414 in FIG. 6) to define a patterned gate structure. The gate sidewalls are then reoxidized (416 in FIG. 6) to form a protective encapsulation layer 513 (e.g., $Si_AO_B$, where A and B are any positive values) thereon, as shown in FIG. 7A.

Figure 7B:
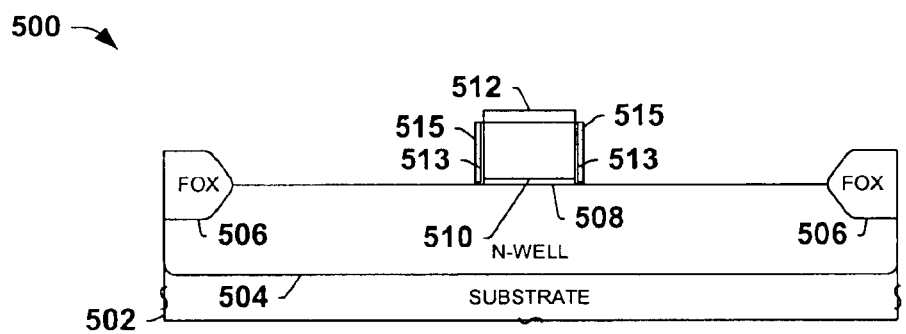
Figure 7C:
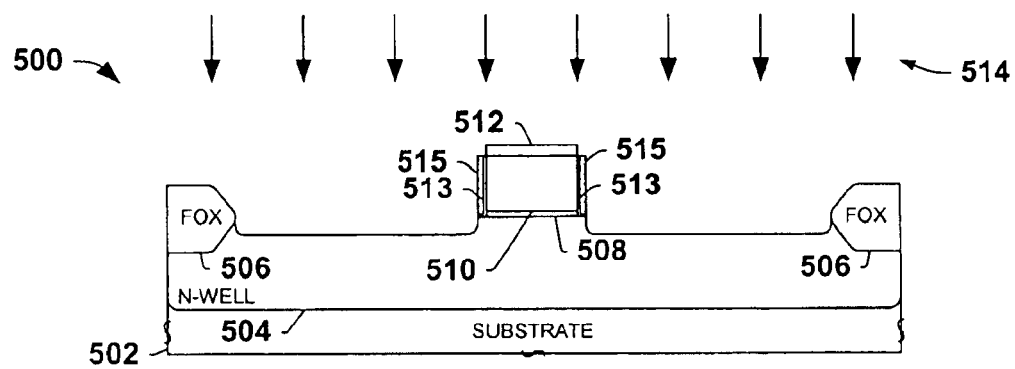

In FIG. 7B, a nitride offset 515 is formed along the sidewalls of the patterned gate structure (418 in FIG. 6), for example, by conformal deposition of a silicon nitride layer (e.g., $Si_CN_D$, where C and D are any positive values) and subsequent anisotropic etch, leaving nitride material offsets 515 along the gate sidewalls. In FIG. 7C, a selective silicon removal process 514 is performed (420 in FIG. 6) to create recesses in prospective source/drain and drain extension regions of the substrate 502. As with the recessed source/drain example in FIGS. 4 and 5A–5G above, the process 514 can be any suitable material removal process selective to dielectrics such as the silicon germanium protection material 512, the nitride offsets 515, and to the field oxide 506, and which removes the desired portions of the substrate 502.

Figure 7D:
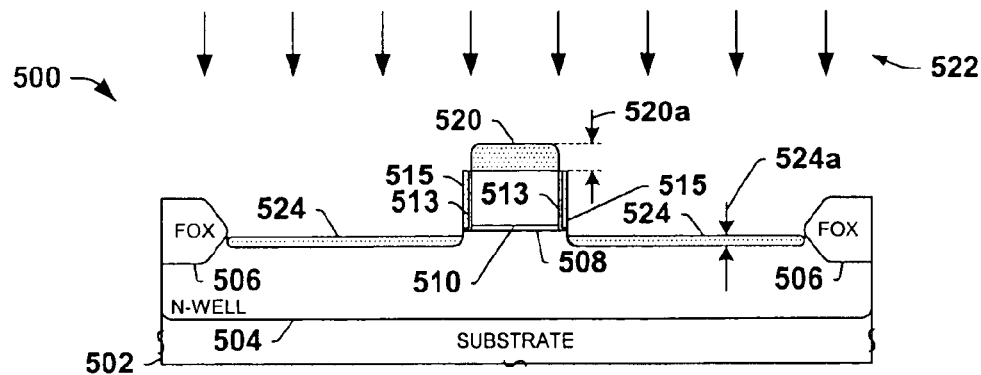
Figure 7E:
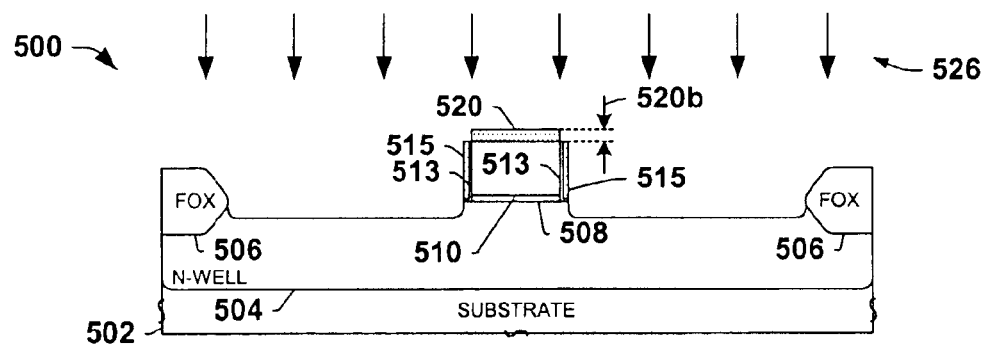
Figure 7F:
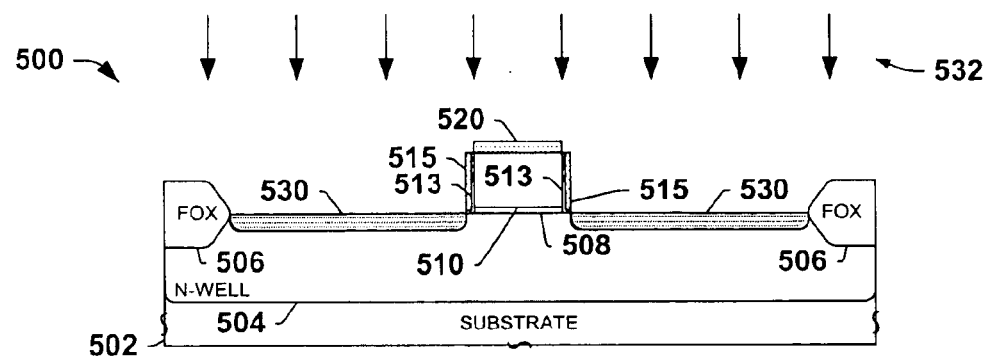
Figure 7G:
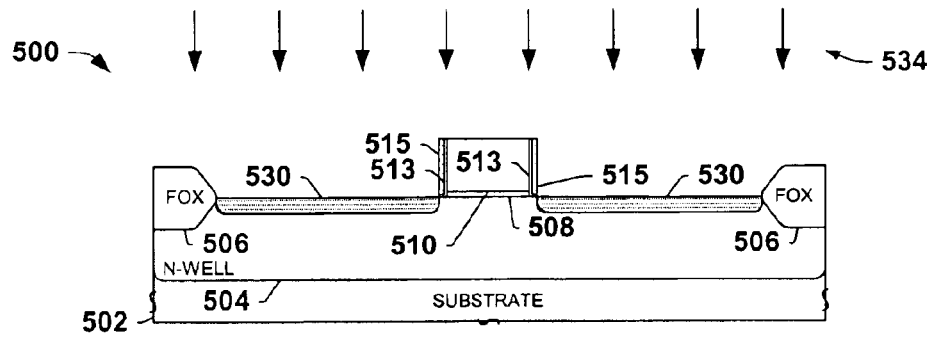

In FIG. 7D, a low temperature wet oxidation process 522 is performed (422 in FIG. 6) to oxidize the protection layer 512 and the recessed portions of the substrate 502. The oxidation 522 in this example creates silicon germanium oxide 520 (e.g., $Si_XGe_YO_Z$) over the gate polysilicon 510 having a thickness 520a of about 170 Å, and silicon oxide material 524 (e.g., $Si_JO_K$) in the recessed prospective source/drain portions of the substrate 502 having a thickness 524a of about 100 Å. In FIG. 7E, an oxide deglaze operation 526 (e.g., HF clean) is performed (424 in FIG. 6), which removes all of the silicon oxide 524, and leaves a portion of the silicon germanium oxide 520 having a thickness 520b of about 100 Å over the gate polysilicon 510. In FIG. 7F, a selective semiconductor material deposition 532 (e.g., CVD epitaxial process) is performed (426 in FIG. 6) to provide epitaxial silicon 530 in the recessed source/drain and drain extension regions of the substrate 502 to any desired thickness, without depositing or growing any silicon on the protected gate polysilicon 510 (e.g., no poly mushrooming). In FIG. 7G, the remaining silicon germanium oxide 520 is removed (428 in FIG. 6) via a second oxide deglaze (e.g., HF clean) process 534.

Figure 7H:
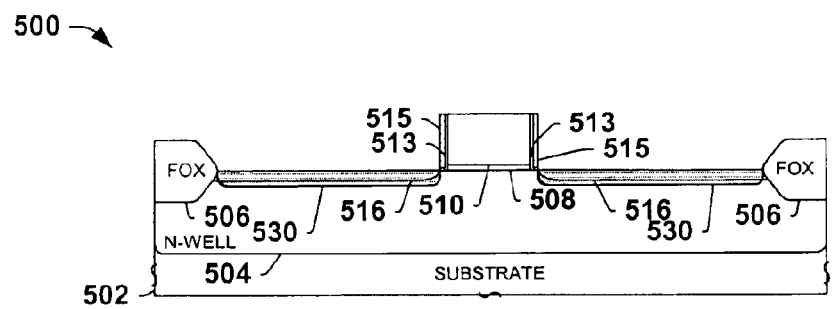
Figure 7I:
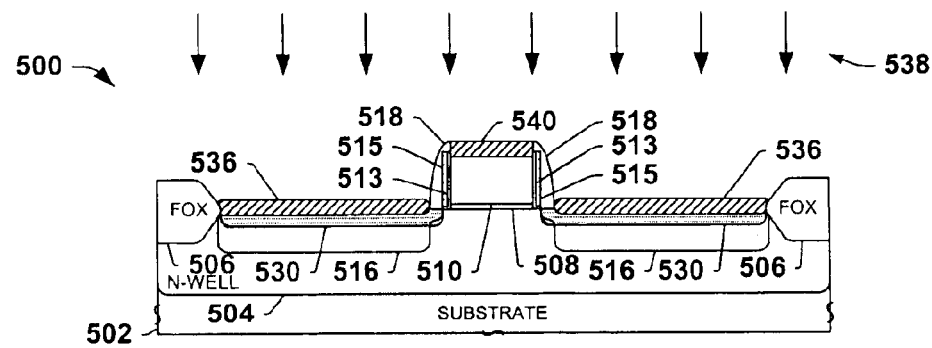

Thereafter in FIG. 7H, drain extension implants are performed (430 in FIG. 6) to dope the exposed source/drain regions 516. In FIG. 7I, sidewall spacers 518 are formed (432 in FIG. 6) of any suitable oxide and/or nitride material or stacks thereof, along the sidewalls of the patterned gate structure, and deep source/drain implants (434 in FIG. 6) further define the source/drains 516. A silicide process 538 is then performed (436 in FIG. 6) to create silicide contacts 536 and 540 over the source/drains 516 and the polysilicon gate 510, respectively. After silicidation, interconnect and other back-end processing is performed (438 in FIG. 6) to complete the recessed HDD PMOS transistor in the device 500, and the method 400 in FIG. 6 ends at 440.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of protecting a transistor gate structure during a selective epitaxial deposition process, the method comprising:

forming silicon germanium oxide above a gate structure;

performing a selective epitaxial deposition process while the silicon germanium oxide is above the gate structure; and removing the silicon germanium oxide after the selective epitaxial deposition process.

2. The method of claim 1, wherein forming silicon germanium oxide above a gate structure comprises:

forming silicon germanium over a gate material layer; and oxidizing the silicon germanium to form silicon germanium oxide over the gate material layer.

3. The method of claim 2, further comprising patterning the silicon germanium and the gate material layer before oxidizing the silicon germanium.

4. The method of claim 3, further comprising forming a sidewall spacer along a lateral side of the patterned gate material layer after patterning the silicon germanium and the gate material layer and before oxidizing the silicon germanium.

5. The method of claim 4, wherein patterning the silicon germanium and the gate material layer exposes a portion of a semiconductor body onto which epitaxial material is to be deposited, wherein oxidizing the silicon germanium forms silicon germanium oxide over the gate material layer and forms an oxide material over the exposed portion of the semiconductor body, further comprising performing a clean operation prior to performing the selective epitaxial deposition process, the clean operation removing the oxide material from the semiconductor body and leaving silicon germanium oxide over the gate material layer.

6. The method of claim 5, further comprising removing a portion of the exposed semiconductor body to form a recess after performing the clean operation and prior to performing the selective epitaxial deposition process.

7. The method of claim 6, wherein the semiconductor body comprises silicon, wherein the gate material layer comprises polysilicon, and wherein performing the selective epitaxial deposition process comprises forming epitaxial silicon in the recess of the semiconductor body while the silicon germanium oxide is above the gate structure.

8. The method of claim 5, wherein the semiconductor body comprises silicon, wherein the gate material layer comprises polysilicon, and wherein performing the selective epitaxial deposition process comprises forming epitaxial silicon over the semiconductor body while the silicon germanium oxide is above the gate structure.

9. The method of claim 3, wherein patterning the silicon germanium and the gate material layer exposes a portion of a semiconductor body onto which epitaxial material is to be deposited, wherein oxidizing the silicon germanium forms silicon germanium oxide over the gate material layer and forms an oxide material over the exposed portion of the semiconductor body, further comprising performing a clean operation prior to performing the selective epitaxial deposition process, the clean operation removing the oxide material from the semiconductor body and leaving silicon germanium oxide over the gate material layer.

10. The method of claim 9, further comprising removing a portion of the exposed semiconductor body to form a recess after performing the clean operation and prior to performing the selective epitaxial deposition process.

11. The method of claim 9, wherein the semiconductor body comprises silicon, wherein the gate material layer comprises polysilicon, and wherein performing the selective epitaxial deposition process comprises forming epitaxial silicon over the semiconductor body while the silicon germanium oxide is above the gate structure.

12. The method of claim 2, wherein the gate material layer comprises polysilicon, and wherein performing the selective epitaxial deposition process comprises forming epitaxial silicon over a semiconductor body while the silicon germanium oxide is above the gate structure.

13. The method of claim 1, wherein the gate structure comprises polysilicon, and wherein performing the selective epitaxial deposition process comprises forming epitaxial silicon over a semiconductor body while the silicon germanium oxide is above the gate structure.

14. A method of forming a protection structure over a transistor gate structure, the method comprising:

forming silicon germanium above a gate material layer;

selectively etching the silicon germanium and the gate material layer to form a patterned gate structure;

oxidizing the silicon germanium and an exposed portion of a semiconductor body to form silicon germanium oxide over the gate structure and an oxide over the exposed portion of the semiconductor body;

removing the oxide material from the semiconductor body without removing all of the silicon germanium oxide;

performing a selective epitaxial deposition process while the silicon germanium oxide is above the gate structure; and removing the silicon germanium oxide after the selective epitaxial deposition process.

15. The method of claim 14, further comprising recessing an exposed portion of the semiconductor body after removing the oxide material from the semiconductor body and prior to performing the selective epitaxial deposition process.

16. A method of fabricating a transistor, the method comprising:

forming a gate dielectric layer above a semiconductor body;

forming a gate electrode layer above the gate dielectric layer;

forming a protection layer above the gate electrode layer;

selectively etching the protection layer and the gate electrode layer to form a patterned gate structure and to expose a portion of the semiconductor body;

oxidizing the protection layer and an exposed portion of the semiconductor body to form a first oxide material on the patterned gate structure and a second oxide material on the exposed portion of the semiconductor body;

performing a first clean operation to remove the second oxide material from the semiconductor body, the first clean operation leaving at least a portion of the first oxide material on the patterned gate structure;

performing a selective semiconductor material deposition process with the first oxide material on the patterned gate structure, the deposition process forming a semiconductor material on the exposed portion of the semiconductor body and substantially no semiconductor material on the first oxide material on the patterned gate structure; and performing a second clean operation to remove the first oxide material after the deposition process.

17. The method of claim 16, wherein forming the gate electrode layer comprises depositing polysilicon above the gate dielectric layer.

18. The method of claim 16, wherein forming a protection layer comprises forming silicon germanium above the gate dielectric layer.

19. The method of claim 18, wherein oxidizing the protection layer comprises forming silicon germanium oxide on the patterned gate structure.

20. The method of claim 16, further comprising recessing an exposed portion of the semiconductor body after performing the first clean operation and prior to the selective semiconductor material deposition process.

* * * * *